United States Patent [19]
Jin et al.

[11] Patent Number: 5,549,977
[45] Date of Patent: Aug. 27, 1996

[54] ARTICLE COMPRISING MAGNETORESISTIVE MATERIAL

[75] Inventors: Sungho Jin, Millington; Mark T. McCormack, Summit; Ramamoorthy Ramesh, Tinton Falls, all of N.J.

[73] Assignee: Lucent Technologies Inc., Murray Hill, N.J.

[21] Appl. No.: 228,168

[22] Filed: Apr. 15, 1994

Related U.S. Application Data

[63] Continuation-in-part of Ser. No. 154,766, Nov. 18, 1993, abandoned.

[51] Int. Cl.$^6$ .............................. G11B 5/66; B05D 5/12; C23C 14/00
[52] U.S. Cl. ............... 428/692; 428/694 R; 428/694 T; 428/702; 428/800; 428/928; 360/113; 338/32 R; 204/192.2; 204/192.21; 252/62.51 R; 324/252; 427/127; 427/128; 427/129; 427/130
[58] Field of Search ................... 428/694 R, 692, 428/694 T, 900, 928, 702; 360/113; 338/32 R; 204/192.2, 192.21; 252/62.51 R; 324/252; 427/127, 128, 129, 130

[56] References Cited

U.S. PATENT DOCUMENTS

| | | | |
|---|---|---|---|
| 4,622,613 | 11/1980 | Nomura | 360/113 |
| 5,287,238 | 2/1984 | Baumgart | 360/113 |
| 5,304,975 | 4/1984 | Saito | 338/32 R |
| 5,341,118 | 8/1994 | Parkin | 338/32 R |

OTHER PUBLICATIONS von Helmolt, R., et al., "Giant Negative Magnetoresistance in Perovskitelike La$_{2/3}$ Ba$_{1/3}$ MnO$_x$ Ferromagnetic Films", *Phys. Rev. Lett.* vol. 71, No. 14, pp. 2331–2333, 4 Oct. 1993.
Chahara, K. et al., "Magnetoresistance in magnetic manganese oxide with intrinsic antiferromagnetic spin structure", *Appl. Phys. Lett.* vol. 63, No. 14, pp. 1990–1992, 4 Oct. 1993.
Levy, Peter M., "Giant Magnetoresistance in Magnetic Layered and Granular Materials", *Science,* vol. 256, pp. 972–973, 15 May 1992.
Fullerton, E., et al., "150% magnetoresistance in sputtered Fe/Cr(100) superlattices", *Appl. Phys. Lett.* vol. 63, No. 12, pp. 1699–1701, 20 Sep. 1993.
Gallagher, P. K., "Oxygen Stoichiometry in Ba$_2$ YCu$_3$ O$_x$", *Mat. Res. Bull.* vol. 22, pp. 995–1006, 1987.

*Primary Examiner*—Leszek Kiliman
*Attorney, Agent, or Firm*—Eugen E. Pacher

[57] ABSTRACT

A magnetoresistance ratio of 200% (absolute value) or more at room temperature in a field of 6T can be achieved in a layer of material of nominal composition XMnO$_y$ (X is La and at least one of Ca, Sr and Ba, y in the range 2–3.5), if, after formation of the layer, the layer is heat treated in an oxygen-rich (O$_2$ partial pressure greater than that of air) atmosphere, typically in flowing O$_2$. The temperature and duration of the heat treatment are in the range 300°–850°C. and 10 minutes–12 hours, and are selected to result in the desired ratio of 200% or more.

18 Claims, 3 Drawing Sheets

ARTICLE COMPRISING MAGNETORESISTIVE MATERIAL

This application is a continuation-in-part of application Ser. No. 08/154,766, filed on Nov. 18, 1993, now abandoned.

FIELD OF THE INVENTION

This invention pertains to magnetoresistive materials, and to articles (e.g., a magnetic field probe or a recording head) that comprise the material.

BACKGROUND OF THE INVENTION

The "magnetoresistance" (MR) of a material is the resistance R(H) of the material in an applied magnetic field H minus the resistance $R_o$ in the absence of an applied field. This resistance difference $\Delta R$ (=R(H)–$R_o$) is typically normalized (e.g., by dividing by R(H)) and expressed as a magnetoresistance ratio in percent.

Conventional materials (e.g., permalloy) typically have a positive MR ratio of a few percent. Recently, relatively large values of MR ratio were observed in metallic multilayer structures, e.g., Fe/Cr or Cu/Co, e.g., as high as 40% at room temperature. See, for instance, E. F. Fullerton, *Applied Physics Letters*, Vol. 63 (12), p. 1699. High MR ratios at low temperature (typically below 50K) were also observed in $Eu_{1-x}Gd_xSe$. Values of MR substantially larger (in absolute value) than those of conventional materials are usually referred to as "giant" MR. See, for instance, P. M. Levy, *Science*, Vol. 256, p. 972.

More recently still, giant MR ratios were observed in mixed metal oxides. K. Chahara et al., *Applied Physics Letters*, Vol. 63 (14), pp. 1990–1992 disclose a ratio of –53% in $La_{0.72}Ca_{0.25}MnO_z$. The material exhibited essentially zero MR at room temperature.

R. von Helmholt et al., *Physical Review Letters*, Vol. 71 (14), pp. 2331–2333 report observation of a room temperature MR ratio of about –150% in thin films of perovskite-like $La_{0.67}Ba_{0.33}$Mn-oxide. As-deposited films were paramagnetic, but after subsequent heat treatment (900° C., air, 12 hours) the samples exhibited a ferromagnetic magnetization curve. Bulk samples of that composition are known to be metallic ferromagnets, with Curie temperature of 343K, but small MR ratio.

It will be readily apparent that for purposes of commercial use, it would be highly desirable to have available a material which exhibits even higher MR at room temperature (~25° C.). A higher MR ratio could lead, inter alia, to increased device sensitivity, and potentially make possible new applications. The possibility of room temperature operation would greatly simplify device design, resulting in considerable cost saving and, potentially, enhanced reliability. This application discloses mixed metal oxides that can exhibit a MR ratio of 200% or more (in absolute value) at room temperature. The application also discloses a method of making such material.

BRIEF DESCRIPTION TO THE DRAWINGS

Figure 6:
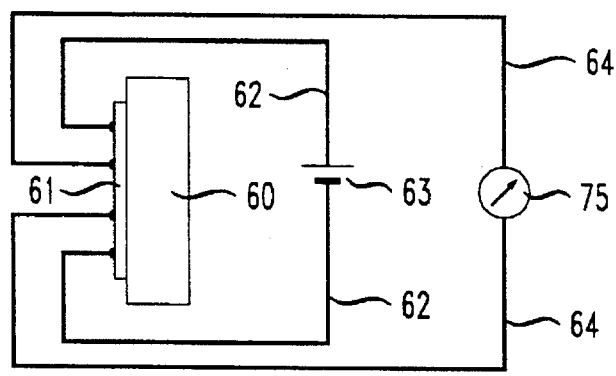

FIG. 6 schematically depicts an exemplary device that comprises material according to the invention.

THE INVENTION

The Helmholt et al. paper (op. cit.) discloses that a heat treatment (12 hours, 900° C., air) transformed an initially paramagnetic La-Ba-Mn-oxide film into a ferromagnetic one, with increased peak temperature and a sharper peak, and teaches that these improvements are related to homogenization during the heat treatment.

Contrary to the prior art teaching, we have found another mechanism to be operative (possibly in conjunction with homogenization), which requires a different preparatory technique. Use of the new technique can result in material having substantially improved MR ratio at room temperature.

More specifically, in one aspect the invention is embodied in an article that comprises a layer of a material that exhibits magnetoresistance at 25° C. and has nominal composition $XMnO_y$, where X is La and at least one of Ca, Sr and Ba. Significantly, the oxygen content (designated by the subscript y) is selected such that the layer of material has, at 25° C., a MR ratio of 200% or more (in absolute value). The MR ratio is defined as $(R(H)–R_o)/R(H)$, where R(H) is the resistance (or resistivity) of the layer of material in an applied magnetic field H, and $R_o$ is the resistance (or resistivity) in the absence of an applied magnetic field. The strength of the applied field is 6 Tesla.

The improved properties of the layer of material are associated with the novel method of making the article. The method comprises forming a layer of nominal composition $XMnO_{y'}$ (y' typically different from y) on a substrate (e.g., MgO,SrTiO$_3$, possibly including an intermediate layer) and heat treating the layer. Significantly, during at least a part of the heat treatment the layer is in contact with an atmosphere that comprises oxygen, the partial pressure of oxygen in the atmosphere being greater than the partial pressure of oxygen in ambient air. In preferred embodiments the atmosphere is flowing oxygen at ambient pressure. The temperature and duration of the heat treatment are selected such that, after completion of the treatment, the material exhibits a MR ratio of at least 200% (absolute value) at 25° C., in a field of 6T.

Typically the film is formed on a substrate, possibly a support body (e.g., a Si wafer) with a buffer layer (e.g., MgO) thereon. Exemplary substrate materials are MgO, SrTiO$_3$, and LaAlO$_3$.

Figure 1:
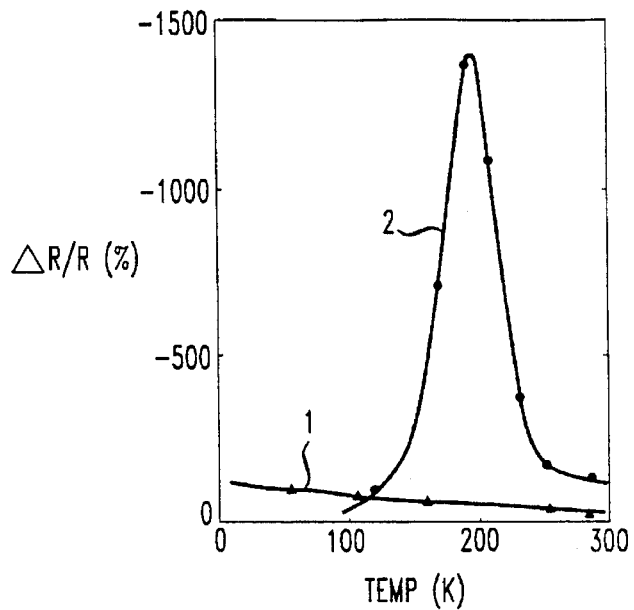
FIGS. 1 and 3 show exemplary data of magnetoresistance ratio vs. temperature.

As mentioned above, (polycrystalline) bulk samples of the relevant oxides do not exhibit large MR. This difference between bulk samples and thin films is exemplified by the MR data of FIG. 1, wherein curves 1 and 2 pertain to a bulk sample and a thin film, respectively. The nominal composition is $La_{0.67}Ca_{0.33}MnO_y$.

Figure 2:
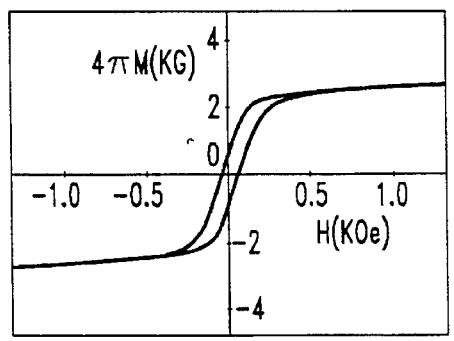
FIG. 2 shows an exemplary magnetization loop.

After an appropriate heat treatment, the relevant oxides are strongly ferromagnetic at room temperature. FIG. 2 shows the magnetization loop of an exemplary material according to the invention. The material was heated 3 hours at 900° C. in flowing O$_2$. The measurement was made at 280K for experimental reasons. The results at 25° C. would be very similar.

Figure 3:
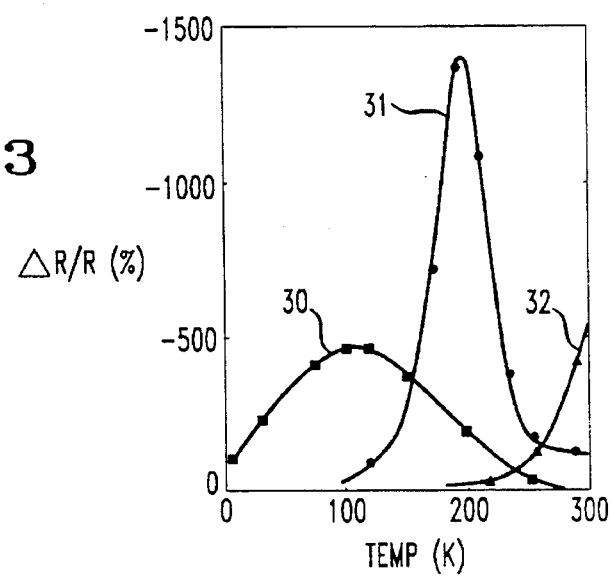

FIG. 3 shows exemplary results of MR ratio vs. temperature, for different heat treatment conditions. The material has nominal composition $La_{0.67}Ca_{0.33}MnO_y$(y~3). Curve 30 pertains to as-deposited material, curve 31 to material that was heated 30 minutes at 700° C. in flowing O$_2$, and curve 32 to material that was heated 3 hours at 800° C. in flowing $O_2$. The data demonstrate a strong dependence of room temperature MR on heat treatment conditions (duration and temperature). The data, when compared to prior art results, also demonstrate the significant improvements that can be attained by heat treatment in an oxygen-rich atmosphere according to the invention. In preferred embodiments of the invention the heat treatment conditions (exemplarily time, temperature and oxygen partial pressure) are selected such that the maximum in the magnetoresistance ratio occurs at, or close to, the intended working temperature of the article according to the invention, e.g., 25° C.

Figure 4:
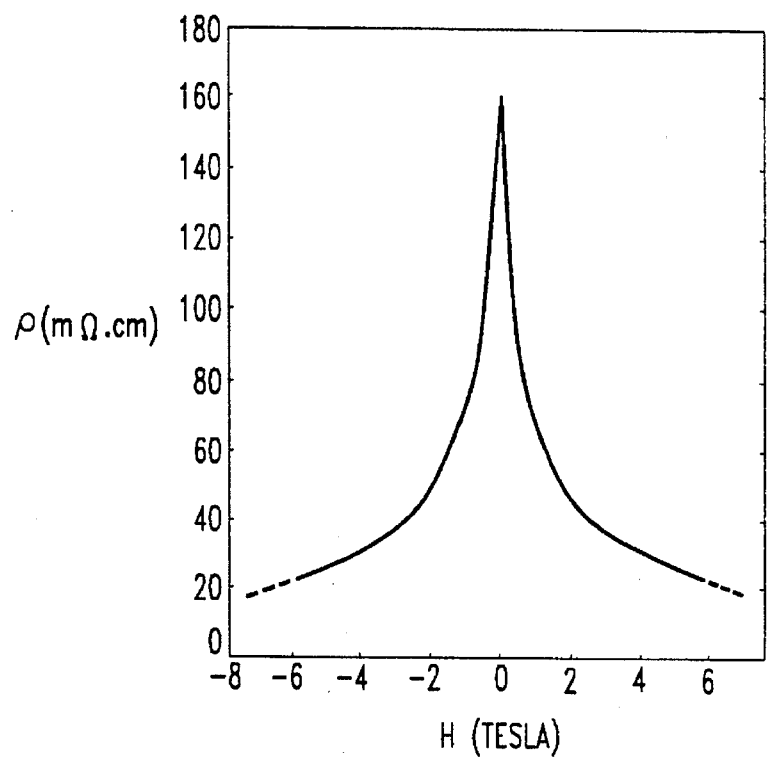
FIGS. 4, 5 and 7 show resistivity vs. applied magnetic field.
Figure 5:
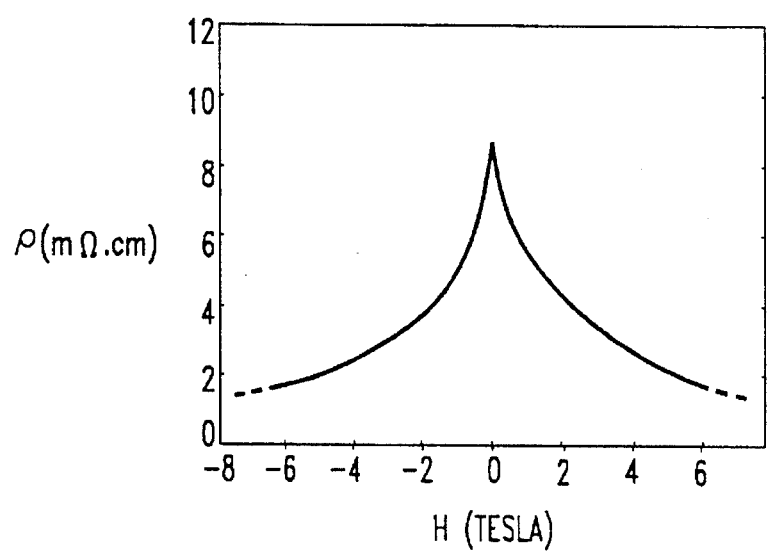

FIGS. 4 and 5 show the resistivity of an exemplary layer at 190K and at (approximately) 25° C, showing MR ratios of about 1400 and 410%, respectively, at 6 Tesla.

Those skilled in the art will appreciate that, in order for a sample to have large MR at room temperature, the sample typically has to be ferromagnetic at room temperature. As the prior art demonstrates, ferromagnetism at room temperature is not an inherent property of layers of the relevant oxides. However, we found that appropriate heat treatment in an $O_2$-rich atmosphere can result in ferromagnetic material. For instance, we have produced a film, of nominal composition $La_{0.67}Ca_{0.33}MnO_y$ that has a Curie temperature of about 350K.

A significant aspect of making material according to the invention is optimization of the oxygen stoichiometry by heat treatment in an oxygen-rich ($O_2$ partial pressure greater than that of ambient air, preferably about 1 atmosphere, but not excluding $O_2$ pressure greater than 1 atmosphere) atmosphere.

Layers of oxide according to the invention can be formed by any appropriate process, including laser ablation, sputtering, evaporation, molecular beam epitaxy, ion beam deposition, chemical vapor deposition, and electro-or electroless deposition. Layer thicknesses will typically be in the range 5 nm–100 μm, depending on user requirements. The layers will typically be formed on a substrate but can be free standing. Layers can be polycrystalline, but will frequently be substantially epitaxial with the substrate. In the latter case, the lattice constant of the substrate (e.g., $SrTiO_3$, $MgO$, $LaAlO_3$) will be close to (typically within about 5%) that of the desired oxide. Use of a buffer layer (or layers) is envisaged. For instance, for some device applications it will frequently be desirable to use a Si body as support body, with an appropriate buffer material (e.g., $LaAlO_3$ or other oxide, or inert metal such as gold) thereon to prevent poisoning of the oxide.

Layer formation by laser ablation or other appropriate technique will typically involve deposition onto a hot substrate (500°–1000° C., preferably about 600°–900° C.), preferably carried out in an oxygen-containing atmosphere.

The subsequent heat treatment in an oxygen-rich atmosphere will generally involve maintaining the film at a temperature in the range 300°–1000° C. for an effective time for raising the oxygen content of the material to a level that is associated with the desired MR ratio (i.e., absolute value at least 200%) at 25° C. Typically the time will be in the range 10 min–100 hours. In order to minimize undesirable substrate/layer interactions, the preferred temperature is below 850° C., and the preferred time is below 12 hours.

Although the detailed reasons for the effectiveness of the novel method have not yet been fully elucidated, experimental results strongly suggest that oxygen stoichiometry plays an important role. For instance, we have found that heat treatment of La-Ca-Mn-oxide film in an inert atmosphere (Ar) results in loss of MR.

The exact range of oxygen content that is associated with the specified range of MR ratios has not yet been determined. However, those skilled in the art know that such a determination requires only a modest experimental effort, and application of a known technique. See, for instance, P. K. Gallagher et al., *Materials Research Bulletin*, Vol. 22, pp. 995–1006, incorporated herein by reference. Our current estimate is that the appropriate values of y are in the range from 2–3.5.

Although most of our experiments involve material of approximately 2:1 La:Ca (or Sr or Ba) ratio, useful compositions are not restricted to this ratio. In particular, in view of the desirability of compositions that can have a Curie temperature at or above room temperature, the Ca content in La-Ca-Mn-oxide is preferably in the range 0.25–0.40, the Ba content in La-Ba-Mn-oxide is preferably in the range 0.20–0.45, and the Sr content in La-Sr-Mn oxide is preferably in the range 0.18–0.50.

Oxide layers according to the invention can be incorporated into a variety of devices. Exemplary of such devices is a magnetic field probe, schematically depicted in FIG. 6, wherein numeral 60 refers to a substrate, 61 to a Mn-oxide layer according to the invention, 62 to electrical leads that connect current source 63 to the layer, 64 to electrical leads that connect the layer to volt meter 65.

Figure 7:
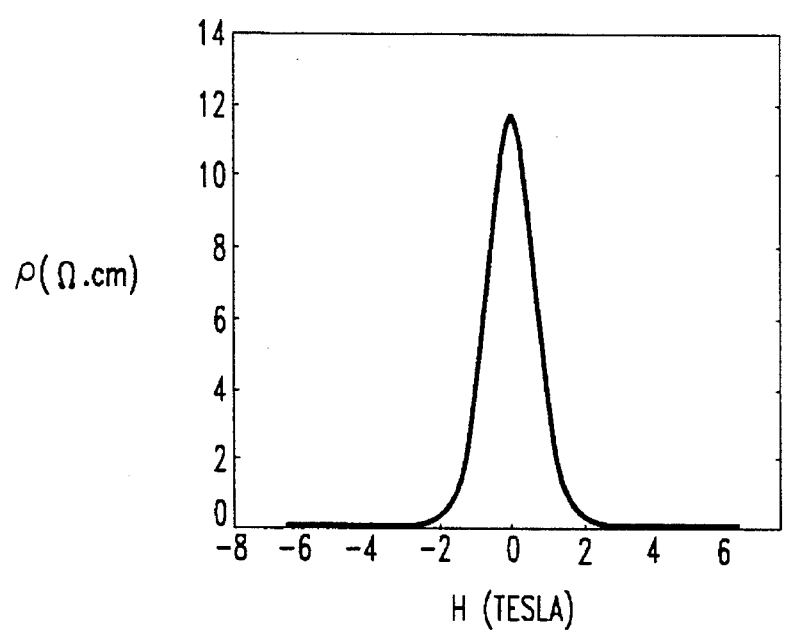

Contrary to the disclosure by Helmholt et al. (op. cit.) regarding $La_{0.67}Ba_{0.33}MnO_x$ films that "... polycrystalline samples did not differ from epitaxial ones..." with regard to MR, we have observed that epitaxial films can have significantly improved MR characteristics. FIG. 7 shows resistivity vs. applied magnetic field of an exemplary film of nominal composition $La_{0.67}Ca_{0.33}MnO_y$ that was epitaxial with a $LaAlO_3$ substrate. The film was deposited at 700° C. in 100 mTorr partial pressure of $O_2$, with a post-deposition treatment of 30 minutes at 900° C. in 3 atmospheres $O_2$. At 77K the resulting material had a resistivity of 11.6 Ω·cm at H=0, and 9.1 mΩ·cm at H=6T, with by far the greatest part of the resistivity change occurring below 2T. The material exhibited a MR ratio of $1.27 \times 10^5$% at 6T and 77K. To the best of our knowledge, this is the highest MR ratio reported to date in manganite films. This high MR ratio is to be contrasted with the relatively low MR ratio of less than about 200% observed in analogous films that had been formed on a substrate with larger lattice mismatch than $LaAlO_3$, namely, (100) MgO.

Herein a film is "epitaxial" with a single crystal substrate if at least one crystallographic axis is common to substrate and film. The single crystal substrate need not be a bulk single crystal body such as a Si wafer but can be a substantially single crystal layer on nonsingle crystal material. Thus, a substrate that consists of an amorphous layer (e.g. $SiO_2$) on a single crystal Si wafer, with a substantially single crystal Bi-titanate layer on the amorphous layer, is a "single crystal" substrate. Those skilled in the art will appreciate that our definition of "epitaxial" includes the case of continuity of structure across the substrate/overlayer interface, but is not limited thereto. A layer is "substantially" single crystal if the material has preferred c-axis orientation, with FWHM in the c-axis x-ray rocking curve of less than 2°. In many cases, the material will also meet the requirement that $\chi_{min}$ is less than 20% (preferably less than 10%), where "$\chi_{min}$" is the well-known Rutherford backscattering ratio.

The film of FIG. 7 was formed by pulsed laser deposition from a relatively dense target. Use of such a target can result in higher quality films with fewer flaws (e.g., particulates and/or pores) and improved epitaxy, and thus is preferred.

Exemplarily, such denser target can be prepared by sintering at higher than conventional temperature (e.g., 1300° C. vs. 1000°–1100° C.).

Although it is frequently desirable for magnetoresistive material to have a large MR ratio at or close to room temperature, those skilled in the art will appreciate that, for instance, a material that exhibits a large MR ratio at liquid nitrogen temperature (77K) or above can find wide technological application since such temperatures can be readily and inexpensively attained and maintained. Nevertheless, it is significant that the temperature of maximum resistance can be affected by processing conditions. In particular, we have discovered that a higher (exemplarily >100 m Torr) oxygen partial pressure ($p_{O_2}$) during deposition tends to result in films with higher temperature of peak resistance. The magnetization, especially near room temperature, also tends to increase with increasing $p_{O_2}$ during deposition. For instance, a La-Ca-Mn-O film deposited at $p_{O_2} \sim 300$ mTorr exhibited MR ratios of 1300% and 470% at 260K and 280K, respectively, with magnetization (4 $\pi$M) in excess of 2000 gauss.

In a variety of applications of MR films it would be advantageous to be able to form a crystalline film on an amorphous substrate, (e.g. a $SiO_2$ layer on a Si wafer), since this would, for instance, facilitate combination of a MR sensor with the requisite circuitry fabricated in/on the Si wafer. However, our results to date indicate that oxide films of the type relevant herein that are deposited directly on $SiO_2$ typically are polycrystalline and have low MR ratio. We have overcome this problem by deposition of the oxide film on a compound substrate that comprises a "template" layer on the amorphous layer. The template layer material is selected to provide a surface of the appropriate crystal symmetry, with at least one epitaxy-relevant lattice dimension close to (typically within $\pm 8\%$) that of the oxide material that is to be deposited thereon. An exemplary and currently preferred template material for La-Ca-Mn-Oxide is $Bi_4Ti_3O_x$ (x~12). $Bi_4Ti_3O_{12}$ has tetragonal lattice symmetry, with a=0.541 nm, b=0.545 nm, and c=3.282 nm. The <110> interplanar spacing of $Bi_4Ti_3O_{12}$ substantially matches with the <100> interplanar spacing of $La_{0.67}Ca_{0.33}MnO_y$ (which is cubic, with a=0.389 nm, since the <110> interplanar spacing of the former is approximately equal to 2× the <100> interplanar spacing of the latter. We have observed that Bi-titanate template layers on $SiO_2$ typically are highly c-axis oriented. Also exemplarily, yttria-stabilized zirconia (YSZ) has a <100> lattice parameter of 0.516 nm, close to that of Si (0.545 nm), with about 6% mismatch.

Those skilled in the art will realize that, in addition to meeting the above symmetry and lattice dimension requirements, template materials also have to be mechanically and chemically stable under the processing temperatures, with a melting point above the highest processing temperature.

Example 1. A 100 nm thick layer of nominal composition $La_{0.67}Ca_{0.33}MnO_y$ was deposited on a (100) $LaAlO_3$ substrate by laser ablation, using a target of the above composition, about 12 mm diameter and 5 mm thickness. Ablation was carried out in an oxygen atmosphere (100 m Torr). The resulting layer was epitaxial with the substrate and had essentially the same composition as the target. The layer was maintained 30 minutes at 700° C. in flowing oxygen (1 atm) in a tube furnace. After removal of the sample from the furnace and cool-down, the resistivity of the layer was measured by a conventional method. The layer exhibited a maximum magnetoresistance ratio of about 1400% in a field of 6T, parallel to the direction of the current in the layer.

Example 2. A portion of the as-deposited layer of Example 1 was heat treated at 800° C. for 30 minutes in flowing oxygen (1 atm). The layer exhibited a magnetoresistance ratio of about 410% near room temperature 25° C. in a field of 6T.

Example 3. A further portion of the as-deposited layer of Example 1 was heat treated as described in Example 2, except that argon was used instead of oxygen. The layer exhibited a magnetoresistance ratio of about 7%, and its resistivity was higher than that of the sample of Example 2 by about 4 orders of magnitude.

Example 4. The following substrates were provided: a single crystal (100) Si wafer; a single crystal (100) Si wafer with about 100 nm YSZ and 50 nm Bi-titanate ($Bi_4Ti_3O_x$, x~12) thereon; and a single crystal (100) Si wafer with about 100 nm amorphous $SiO_2$ thereon, with about 50 nm of Bi-titanate on the $SiO_2$. The YSZ and titanate layers were deposited in situ by the previously referred to pulsed laser deposition technique. The YSZ layer was highly c-axis oriented and substantially single crystal. The titanate layers were highly c-axis textured, with the a-b plane parallel to the substrate surface. On the substrates were deposited about 100 nm thick films of nominal composition $La_{0.67}Ca_{0.33}MnO_y$ (y~3) by laser ablation from a target of the same nominal metal composition, substantially as described in Example 1. The substrate temperature during deposition was in the range 600°–700° C., the deposition was carried out under 100 m Torr partial pressure of $O_2$. Growth on the $Bi_4Ti_3O_x$/YSZ/Si and $Bi_4Ti_3O_x$/$SiO_2$/Si substrates was epitaxial. After deposition the films were heat treated at 750° C. for 2 hours in $O_2$ (1 atmosphere). The MR of the resulting films was measured as a function of temperature by a conventional 4-point probe technique. The applied magnetic field was 2T. The maximum MR ratios were found to occur at temperatures in the range 110–140K and were less than 30% for the layer on the Si substrate, 80% for the layer on the $Bi_4Ti_3O_x$/YSZ/Si substrate, and 1370% for the layer on the $Bi_4Ti_3O_x$/$SiO_2$/Si substrate.

We claim:

1. An article comprising a layer of a material that exhibits magnetoresistance at 25° C. and has nominal composition $XMnO_y$, where X is La and at least one member of the group consisting of Ca, Sr and Ba;

CHARACTERIZED IN THAT the layer of material has a magnetoresistance ratio having an absolute value of at least 200% at 25° C., the magnetoresistance ratio being defined as $(R(H)—R_o)/R(H)$, where R(H) is the resistance of the layer in an applied magnetic field H of magnitude 6 Tesla, and $R_o$ is the resistance of the layer in the absence of an applied magnetic field; wherein y is selected to provide the layer with said magnetoresistance ratio.

2. Article according to claim 1, wherein the layer is disposed on a substrate and is substantially epitaxial therewith, and wherein 2<y<3.5.

3. Article according to claim 1, wherein said magnetoresistance ratio has a maximum in absolute value at a temperature substantially equal to 25° C.

4. An article according to claim 1, wherein the material has nominal composition $La_{1-x}Ca_xMnO_y$, with 0.25<x<0.40, or the material has nominal composition $La_{1-x}Sr_xMnO_y$, with 0.18<x<0.50, or the material has nominal composition $La_{1-x}Ba_xMnO_y$, with 0.20<x<0.45.

5. An article according to claim 1, wherein the layer was formed by a process that comprises laser ablation from a target that was sintered at a temperature above 1100° C.

6. An article according to claim 1, wherein the layer was formed by a process that comprises heat treating the layer in an atmosphere having an $O_2$ partial pressure greater than 100 mTorr.

7. Article according to claim 2, wherein the substrate is a compound substrate comprising a Si support body and a buffer layer, the layer being substantially epitaxial with the buffer layer.

8. Method of making an article that comprises a layer of material that exhibits magnetoresistance at 25° C., the method comprising a) forming a layer of nominal composition $XMnO_y$, where X is La and at least one of Ca, Sr and Ba; and b) heat treating the layer in an oxygen-containing atmosphere;

CHARACTERIZED IN THAT c) the oxygen partial pressure of said atmosphere is greater than the oxygen partial pressure of ambient air; and d) the heat treatment time and temperature are selected to provide material that exhibits at 25° C. a magnetoresistance ratio having an absolute value of at least 200%, said magnetoresistance ratio being defined as $(R(H)-R_o)/R(H)$, where R(H) is the resistance of the layer in an applied magnetic field H of magnitude 6 Tesla, and $R_o$ is the resistance of the layer in the absence of an applied magnetic field.

9. Method according to claim 8, wherein the oxygen partial pressure is one atmosphere or more, the heat treatment temperature is in the range 300°–850° C., the heat treatment time is in the range 10 minutes–12 hours, and 2<y<3.5.

10. Method according to claim 8, the method comprising forming the layer on a substrate such that the layer is substantially epitaxial with the substrate.

11. Method according to claim 8, wherein the layer is formed such that the layer is epitaxial with a buffer region.

12. Method according to claim 8, werein the forming step comprises forming said layer such that the nominal composition is $La_{1-x}Ca_xMnO_y$, with $0.25 \leq x \leq 0.40$, or the nominal composition is $La_{1-x}Sr_xMnO_y$, with $0.18 \leq x \leq 0.50$, or the nominal composition is $La_{1-x}Ba_xMnO_y$, with $0.20 \leq x \leq 0.45$.

13. An article comprising a layer of material that exhibits magnetoresistance and has nominal composition $XMnO_y$, where X is La and at least one member of the group consisting of Ca, Sr and Ba, said layer disposed on a substrate;

CHARACTERIZED IN THAT a) the layer is epitaxial with the substrate; and b) the layer has a magnetoresistance (MR) ratio having an absolute maximum value of at least 1000%, the MR ratio being defined as $(R(H)-R_o)/R(H)$, where R(H) is the resistance of the layer in an applied magnetic filed H of magnitude 6T, and $R_o$ is the resistance of the layer in the absence of an applied magnetic field, wherein y has a value that provides the layer with said MR ratio.

14. An article according to claim 13, wherein the MR ratio is at least 10,000%.

15. An article according to claim 13, wherein said substrate comprises a substantially single crystal template layer.

16. An article according to claim 13, wherein the layer was formed by a process that comprises laser ablation from a target that was sintered at a temperature above 1100° C.

17. An article according to claim 15, wherein said template layer is disposed intermediate an amorphous layer and the layer that exhibits MR.

18. An article according to claim 17, wherein the amorphous layer is $SiO_2$, and the template layer is bismuth titanate.

* * * * *

UNITED STATES PATENT AND TRADEMARK OFFICE
CERTIFICATE OF CORRECTION

PATENT NO. : 5,549,977
DATED : August 27, 1996
INVENTOR(S) : Sungho Jin, Mark T. McCormack and Ramamoorthy Ramesh It is certified that error appears in the above-indentified patent and that said Letters Patent is hereby corrected as shown below:

Title page, item [73]

Please add to the Assignee listing on the first page of the patent Bellcore Bell Communications Research, Inc. . The patent does not show the second assignee Bellcore.

Signed and Sealed this

First Day of July, 1997

*Attest:*

BRUCE LEHMAN

*Attesting Officer*  *Commissioner of Patents and Trademarks*